(12) United States Patent
Watanabe

(10) Patent No.: US 6,229,162 B1
(45) Date of Patent: May 8, 2001

(54) PLANAR-TYPE AVALANCHE PHOTODIODE

(75) Inventor: Isao Watanabe, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/294,085

(22) Filed: Apr. 19, 1999

(30) Foreign Application Priority Data

May 8, 1998 (JP) .................................................. 10-126096

(51) Int. Cl.$^7$ ............................................... H01L 31/0328
(52) U.S. Cl. ......................... 257/186; 257/184; 257/186; 257/199
(58) Field of Search .................................... 257/184, 186, 257/199, 21, 438, 452, 466, 457, 459; 438/48, 91, 199, 380

(56) References Cited

U.S. PATENT DOCUMENTS

| 5,288,989 | * | 2/1994 | Ishaque et al. | 250/214 |
| 5,543,629 | * | 8/1996 | Nakamura et al. | 257/21 |
| 5,703,379 | * | 12/1997 | Le Person et al. | 257/214 |
| 5,763,903 | * | 6/1998 | Mandai et al. | 257/186 |
| 5,942,771 | * | 8/1999 | Ishimura | 257/184 |

FOREIGN PATENT DOCUMENTS

| 56-58283 | * | 5/1981 | (JP) . |
| 62-176175 | * | 8/1987 | (JP) . |
| 2-248081 | | 10/1990 | (JP) . |
| 4-312986 | * | 11/1992 | (JP) . |
| 6-151942 | * | 11/1992 | (JP) . |
| 7-312442 | | 11/1995 | (JP) . |
| 9-199753 | | 7/1997 | (JP) . |

OTHER PUBLICATIONS

I. Watanabe et al, Jun. 1996, IEEE Photonics Technology Letters, vol.8, No.6, 827–829.*
I. Watanabe, Dec. 1997, IEEE Photonics Technology Letters, vol.9, No. 12, 1619–1621.*
J.C. Campbell wt al, Mar. 1998, IEEE J. of Quantum Electronics, vol.7, No. 11, 496–500.*
Y.Liu et al, Feb. 1992, J of Lightwave Technology, vol.10, No. 2, 182–193.*

(List continued on next page.)

Primary Examiner—Tom Thomas
Assistant Examiner—Donghee Kang
(74) Attorney, Agent, or Firm—Young & Thompson

(57) ABSTRACT

With the object of providing a high-speed high-sensitivity planar-type avalanche photodiode (APD) that has high reliability, great manufacturing tolerance and a wide dynamic range, there is presented a planar-type avalanche photodiode, having on a semiconductor substrate a layered structure comprising specific 6 layers, a specific conductive-type acquired region in a peripheral section of a photo-sensitive region and a specific ring-shaped isolation trench region in said photo-sensitive region, wherein a ring-shaped region of the second conductive-type semiconductor cap layer that is inscribed in said ring-shaped isolation trench and located in the periphery of the photo-sensitive region is formed thin to have a thickness equal to or less than the thickness of said semiconductor multiplication layer, and the first conductive-type semiconductor field buffer layer located directly under the ring-shaped cap region, together with a peripheral region in the field buffer layer, is formed to have a lower carrier concentration than the first conductive-type field buffer layer in said photo-sensitive region.

13 Claims, 4 Drawing Sheets

OTHER PUBLICATIONS

L.E. Tarof et al, Nov. 1995, IEEE Photonics Technology Letters, vol.7, No.11, 1330–1332.*

Kenko, 1996, 22nd EC on optical communication (ECOC'96, Olso), MoC.4.3, 1.137–1.144.*

J.N.Haralson et al, Dec. 1999, IEEE J. of Quantum Electronics, vol.35, No. 12, 1863–1869.*

Isao Watanabe et al, Jun. 1997, J. of Lightwave Technology, vol. 15, No.6, 1012–1019.*

* cited by examiner

PLANAR-TYPE AVALANCHE PHOTODIODE

BACKGROUND OF THE INVENTION

1. Field of the Invention

The present invention relates to a planar-type avalanche photodiode (referred to as APD hereinafter) that has high sensitivity and a wide dynamic range as well as high reliability suitable for use in high-speed optical fiber communication.

2. Description of the Prior Art

As a high-speed high-sensitivity optical receiver for use in the next generation optical fiber communication system, a planar-type superlattice APD shown in FIG. 6 has been reported (IEEE Photonics Technol. Lett., Vol.8, pp.827–829, 1996; Japanese Patent Application No.299996/1994/ Japanese Patent Application Laid-open No. 312442/1995).

In such a device that is a first example of the prior art herein, a higher gain-bandwidth product (GB product) and lower noise are brought about through the enhancement effect of an InAlAs/InAlGaAs superlattice multiplication layer on the ionization rate ratio. At the same time, higher reliability is also produced therein by a structure in which only a stable InP planar pn-junction is exposed to the surface.

In such a conventional planar-type superlattice APD, a Ti-implanted guard-ring is formed in order to suppress edge-multiplication. The operation principle thereof is as follows. Due to Ti implantation, the p-concentration in a p-InP field buffer layer of the guard-ring section decreases locally. Taking advantage of this decrease, the punchthrough voltage of a depletion layer to a photo-absorption layer in the guard-ring section is reduced, as shown in FIG. 5, and thereby the bias voltage applied to an edge section is spread over the photo-absorption layer section, suppressing the edge electric field increase.

If the spreading of the voltage over the photo-absorption layer hereat is excessive, however, the field strength of the photo-absorption layer in the edge section becomes too high and passes over the tunneling dark current limit (normally 200 kV/cm) and the dark current of the APD device is increased. This indicates that there exists the optimum value for the dose of Ti implantation. Under such conditions, in order to provide a wider dynamic range for the high frequency response of the APD, in other words, to obtain a high frequency response (a 3 dB bandwidth above 10 GHz) even at a low bias and a low multiplication factor M (M>~1.5), the maximum field strength in the photo-absorption layer at the time of breakdown should be set as high as ~150 kV/cm or so. In this case, however, when the bias voltage is spread over the photo-absorption layer in order to bring about the above-mentioned guard-ring effect, there arises another problem that the tunnel dark current is liable to generate in the photo-absorption layer section of the guard-ring because the first setting of the field strength itself is already relatively high.

Accordingly, the conventional planar-type superlattice APD has a problem that a range of the optimum value for the dose of Ti implantation mentioned above tends to become small, depending on the setting of the maximum field strength in the photo-absorption layer.

SUMMARY OF THE INVENTION

In light of the above problems, an object of the present invention is to provide a planar-type APD that does not have such problems as described above and that has a greater manufacturing tolerance, high reliability, high sensitivity as well as a wide dynamic range.

In accordance with an aspect of the present invention, there is disclosed a planar-type avalanche photodiode; having on a semiconductor substrate:

a layered structure comprising a first conductive-type semiconductor buffer layer, a first conductive-type semiconductor photo-absorption layer, a first conductive-type semiconductor field buffer layer, a semiconductor multiplication layer, a second conductive-type semiconductor cap layer and a second conductive-type semiconductor contact layer;

a first conductive-type acquired region, in a peripheral section of a photo-sensitive region, from the surface down to a level at least deep enough to reach said first conductive-type semiconductor field buffer layer; and a ring-shaped isolation trench region, between the conductive-type semiconductor cap layer in said photo-sensitive region and said first conductive-type acquired region, with a depth that is equivalent to a sum of thicknesses of said second conductive-type semiconductor contact layer and cap layer; wherein:

a ring-shaped region of the second conductive-type semiconductor cap layer that is inscribed in said ring-shaped isolation trench and located in the periphery of the photo-sensitive region is formed thin to have a thickness equal to or less than the thickness of said semiconductor multiplication layer; and the first conductive-type semiconductor field buffer layer located directly under the ring-shaped cap region, together with a peripheral region in the field buffer layer, is formed to have a lower carrier concentration than the first conductive-type field buffer layer in said photo-sensitive region.

In accordance with another aspect of the present invention, there is disclosed another planar-type avalanche photodiode; having on a semiconductor substrate:

a layered structure comprising a first conductive-type semiconductor buffer layer, a first conductive-type semiconductor photo-absorption layer, a first conductive-type semiconductor field buffer layer, a semiconductor multiplication layer, a second conductive-type semiconductor cap layer and a second conductive-type semiconductor contact layer;

a first conductive-type acquired region, in a peripheral section of a photo-sensitive region, from the surface down to a level at least deep enough to reach said first conductive-type semiconductor field buffer layer;

a ring-shaped isolation trench region, between the conductive-type semiconductor cap layer in said photo-sensitive region and said first conductive-type acquired region, with a depth that is more than the depth of said second conductive-type semiconductor contact layer and less than the depth of said cap layer; and, in addition, a highly-resistive region in an outer ring-shaped region that is formed, by dividing said ring-shaped isolation trench into two ring-shaped concentric regions, to a depth that reaches said semiconductor multiplication layer; wherein:

said first conductive-type semiconductor field buffer layer located directly under an internal ring-shaped region, together with a peripheral region in the field buffer layer, is formed to have a lower carrier concentration than the first conductive-type field buffer layer in said photo-sensitive region.

Further, the planar-type avalanche photodiode of the present invention is characterized in that a first etching stop layer is set between said semiconductor multiplication layer and second semiconductor cap layer; or characterized in that said second conductive-type cap layer is divided in the direction of layers and a second and a third etching stop layers are set in between.

Further, the planar-type avalanche photodiode of the present invention is characterized in that said second conductive-type semiconductor cap layer is divided in the direction of the layers and the first etching stop layer is set in between; or characterized in that said semiconductor multiplication layer is composed of a material selected from the group consisting of InAlAs, InAlAsP, semiconductor alloy compounds containing InAlAs, an InAlAs/InAlGaAs superlattice, an InAlAs/InGaAs superlattice and an InAlAs/InGaAsP superlattice; or characterized in that said second conductive-type semiconductor field buffer layer is composed of a material selected from the group consisting of InP, InGaAsP, InAlAs, InAlGaAs and InAlAsP; or characterized in that the first etching stop layer in said device structure is composed of InP; or characterized in that the second etching stop layer in said device structure is composed of InP and the third etching stop layer therein is composed of InGaAs or InAlGaAs; or characterized in that said highly-resistive region is formed by ion implantation of any selected among Ti, Fe, Co, O, H, He, B, Ar, N and C or a combination of these, or alternatively by diffusion of impurities; or characterized in that said field buffer layer region with the modulated carrier concentration is formed by ion implantation of any selected among Ti, Fe, Co, O, H, He, B, Ar, N and C or a combination of these, or alternatively by diffusion of impurities.

EXPLANATION OF SYMBOLS

Figure 1:
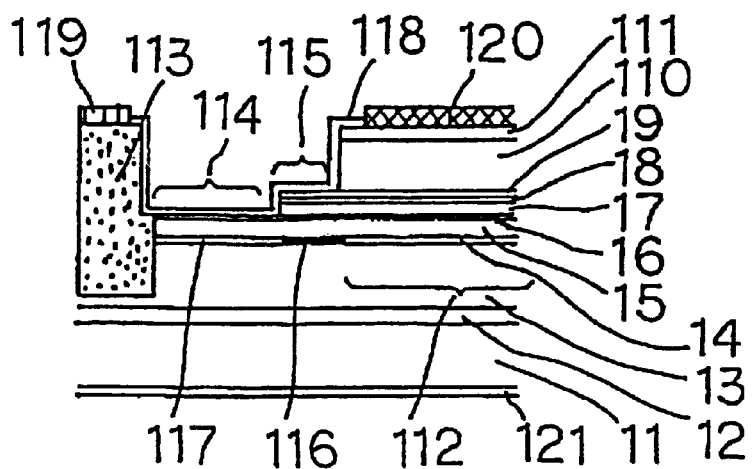
FIG. 1 is a schematic cross-sectional view showing a device structure of the present invention.

11 . . . Semiconductor substrate
12 . . . First conductive-type semiconductor buffer layer
13 . . . First conductive-type semiconductor photo-absorption layer
14 . . . First conductive-type semiconductor field buffer layer
15 . . . Semiconductor multiplication layer
16 . . . Third semiconductor stop layer
17 . . . Second conductive-type second semiconductor cap layer
18 . . . Second conductive-type second semiconductor etching stop layer
19 . . . Second conductive-type first semiconductor etching stop layer
110 . . . Second conductive-type first semiconductor cap layer
111 . . . Second conductive-type semiconductor contact layer
112 . . . Photo-sensitive region
113 . . . First conductive-type acquired region
114 . . . Ring-shaped isolation trench
115 . . . Thin ring-shaped second conductive-type cap layer
116 . . . First conductive-type field buffer layer directly under thin ring-shaped second conductive-type cap layer
117 . . . Peripheral section in first conductive-type field buffer layer
118 . . . Passivation film
119 . . . p-electrode
120 . . . n-electrode
121 . . . Anti-reflective (AR) coat
21 . . . Semiconductor substrate
22 . . . First conductive-type semiconductor buffer layer
23 . . . First conductive-type semiconductor photo-absorption layer
24 . . . First conductive-type semiconductor field buffer layer
25 . . . Semiconductor multiplication layer
27 . . . Second conductive-type second semiconductor cap layer
28 . . . Second conductive-type semiconductor etching stop layer
210 . . . Second conductive-type first semiconductor cap layer
211 . . . Second conductive-type semiconductor contact layer
212 . . . Photo-sensitive region
213 . . . First conductive-type acquired region
214 . . . Ring-shaped isolation trench
215 . . . Highly-resistive region
216. . . First conductive-type field buffer layer directly under thin ring-shaped second conductive-type cap layer
217 . . . Peripheral section in first conductive-type field buffer layer
218 . . . Passivation film
219 . . . p-electrode
220 . . . n-electrode
221 . . . AR coat
31 . . . Semiconductor substrate
32 . . . First conductive-type semiconductor buffer layer
33 . . . First conductive-type semiconductor photo-absorption layer
34 . . . First conductive-type semiconductor field buffer layer
35 . . . Semiconductor multiplication layer
36 . . . Second conductive-type semiconductor cap layer (A case without any etching stop layer. Layers 16, 18 and 19 in FIG. 1 are omitted and layers 17 and 110 are combined into this layer.)

37 ... Second conductive-type semiconductor contact layer
38 ... Photo-sensitive region
39 ... First conductive-type acquired region
310 ... Ring-shaped isolation trench
311 ... Thin ring-shaped second conductive-type cap layer
312 ... Concentration-lowered field buffer layer region directly under thin ring-shaped cap layer
313 ... Concentration-lowered field buffer layer region
314 ... Passivation film
315 ... Equipotential lines
41 ... Semiconductor substrate
42 ... First conductive-type semiconductor buffer layer
43 ... First conductive-type semiconductor photo-absorption layer
44 ... First conductive-type semiconductor field buffer layer
45 ... Semiconductor multiplication layer
46 ... Second conductive-type semiconductor cap layer
47 ... Second conductive-type semiconductor contact layer
48 ... Photo-sensitive region
49 ... First conductive-type acquired region
410 ... Ring-shaped isolation trench
411 ... Concentration-lowered field buffer layer region
412 ... Passivation film
413 ... Equipotential lines
51 ... Electric field profile in the direction of the depth in a central photo-sensitive section
52 ... Electric field profile in the direction of the depth in a guard-ring section
61 ... Semi-insulating (SI-) InP substrate
62 ... $p^+$-type buffer layer
63 ... $p^-$-type InGaAs photo-absorption layer
64 ... p-type InP field buffer layer
65 ... Undoped InAlAs/InAlGaAs superlattice multiplication layer
66 ... $n^+$-type InAlAs cap layer
67 ... $n^+$-type InGaAs contact layer
68 ... Ring-shaped isolation trench
69 ... p-type acquired region
610 ... Guard-ring
611 ... p-electrode
612 ... n-electrode
613 ... Passivation film
71 ... $n^+$-type GaAs substrate
72 ... $n^+$-type AlGaAs layer
73 ... n-type GaAs layer
73' ... n-type GaAs layer
74 ... n-type AlGaAs layer
74' ... n-type AlGaAs layer
75 ... Insulating film
75' ... Insulating film
76 ... Zn diffused layer
77 ... pn-junction face
78 ... p-electrode
79 ... n-electrode
710 ... Substrate etching face
81 ... $n^+$-type InP substrate
82 ... n-type InP buffer layer
83 ... n-type InGaAs layer
84 ... n-type InGaAsP valance band discontinuity buffer layer
85 ... $n^-$-type InP layer
86 ... Si-implanted n-type InP multiplication region
87 ... $n^-$-type InP re-growth layer
88 ... Guard-ring region
89 ... p-type diffused region
810 ... AR coat
811 ... p-electrode
812 ... n-electrode

DETAILED DESCRIPTION OF THE INVENTION

To illustrate the present invention further, preferred embodiments of the present invention are described herein below and the operation of the planar-type avalanche photodiode in accordance with the present invention is described with reference to FIG. 1~FIG. 4. FIG. 1 and FIG. 2, FIG. 3 and FIG. 4 are schematic views showing a device structure of the present invention each, an electric potential profile of the present invention and an electric potential profile of a conventional example, respectively.

A first embodiment of the present invention shown in FIG. 1 is an avalanche photodiode having a first conductive-type semiconductor buffer layer 12, a first conductive-type semiconductor photo-absorption layer 13, a first conductive-type semiconductor field buffer layer 14, a semiconductor multiplication layer 15, a third semiconductor etching stop layer 16, a second conductive-type semiconductor cap layer 17, a second conductive-type second semiconductor etching stop layer 18, a second conductive-type first semiconductor etching stop layer 19, a second conductive-type first semiconductor cap layer 110 and a second conductive-type semiconductor contact layer 111 layered on a semiconductor substrate 11 in succession; wherein a first conductive-type acquired region 113 is formed, in the peripheral region of a photo-sensitive region 112, down to a level deeper than said first conductive-type semiconductor field buffer layer 14; and between this region 113 and said photo-sensitive region 112 a ring-shaped isolation trench 114 is formed to have a depth equivalent to a sum of depths of the above-mentioned five layers 17, 18, 19, 110 and 111; and, in addition, being inscribed in this trench 114, a ring-shaped peripheral section 115 of said photo-sensitive region 112 is formed to have a thickness equal to or less than the thickness of said multiplication layer 15; and further, directly under this ring-shaped cap layer 115, a field buffer layer 116, together with a peripheral section of the field buffer layer 117, is made to have a lower carrier concentration than the field buffer layer 14 in said photo-sensitive region.

Figure 3:
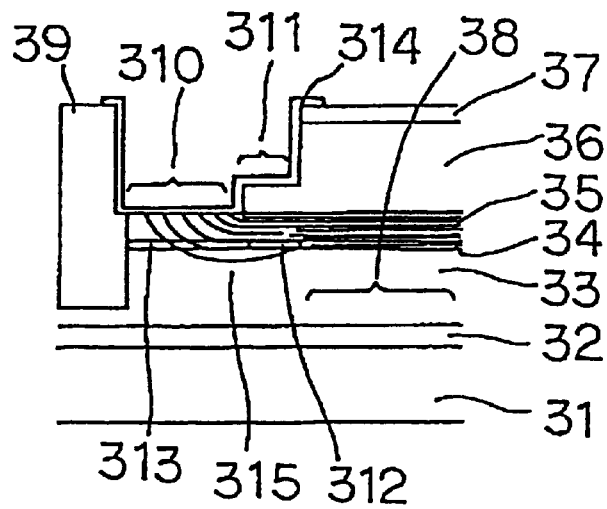
FIG. 3 is a schematic cross-sectional view showing an electric potential profile in a device of the present invention.

In the structure of the present invention, a concentration-lowered field buffer layer region 313 in FIG. 3, by design, eats into the inside of a thin ring-shaped cap layer 311 in said photo-sensitive section to form a concentration-lowered field buffer region 312. Therefore, even when the amount of electric field drop (modulation) in its peripheral section 313 is the same as in a conventional device shown in FIG. 4, in making comparison between their respective electric potential profiles, the density of equipotential lines in a photo-sensitive edge section for the device of the present invention may be smaller, as shown in FIG. 3. In effect, the structure of the present invention enables to suppress the edge electric field increase easily. In other words, this structure has an advantage that even a small amount of modulation can bring about the guard-ring effect and expand the manufacturing tolerance further. Regarding a width of the above-mentioned section that is designed to eat into, a width in a range between 1 and 10 μm or so is preferable, which satisfies both requirements that effects of the present invention are brought about and that an increase in the device capacitance is kept comparatively small.

Figure 4:
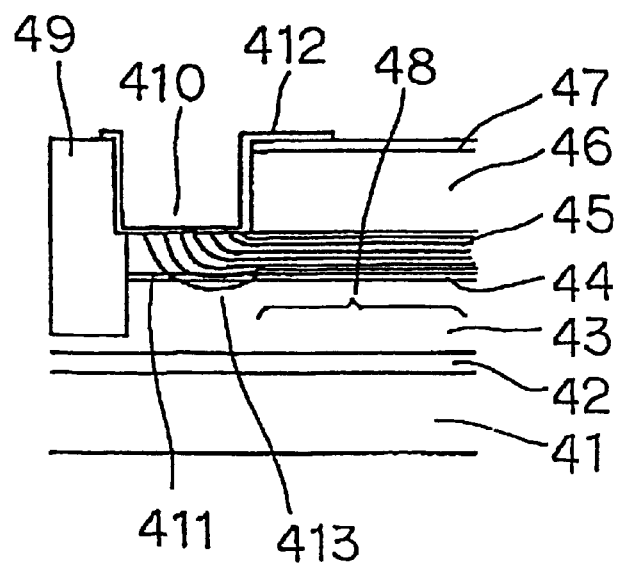
FIG. 4 is a schematic cross-sectional view showing an electric potential profile in a conventional device.
Figure 5:
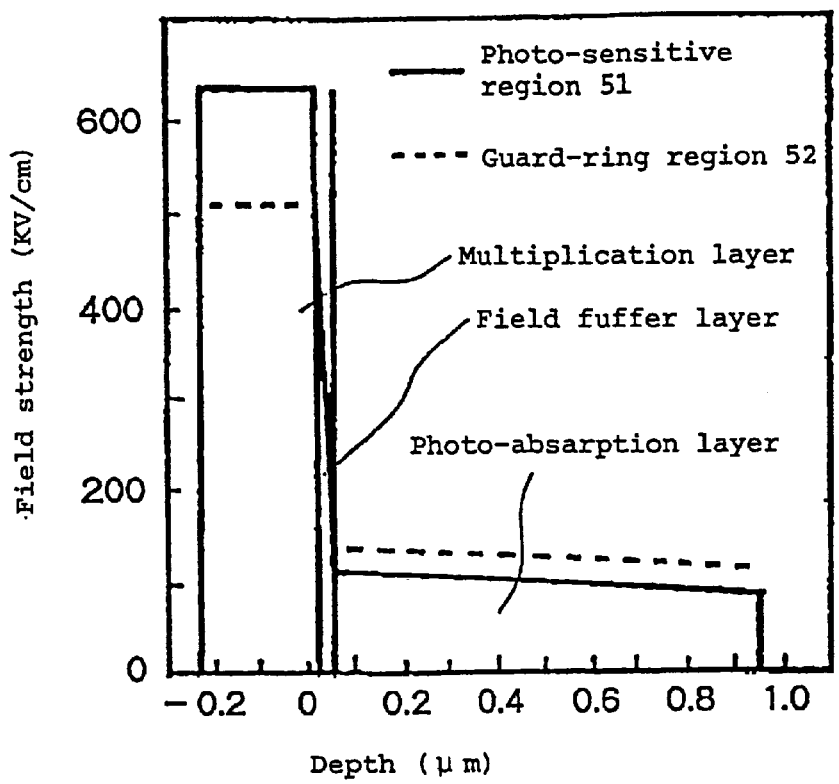
FIG. 5 is a diagram showing electric field profiles in the direction of the depth of the device in accordance with the present invention.
Figure 6:
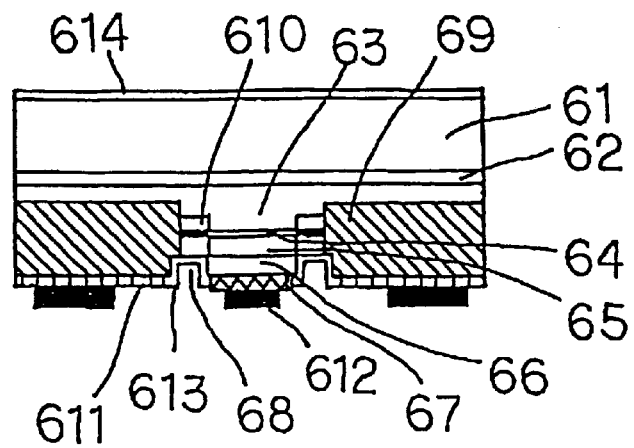
FIG. 6 is a schematic cross-sectional view showing a device structure of a first example of the prior art.

While the above description with reference to FIG. 3 and FIG. 4 has been made for a case without any etching stop layers, the same principle applies to a case with an etching stop layer.

Figure 2:
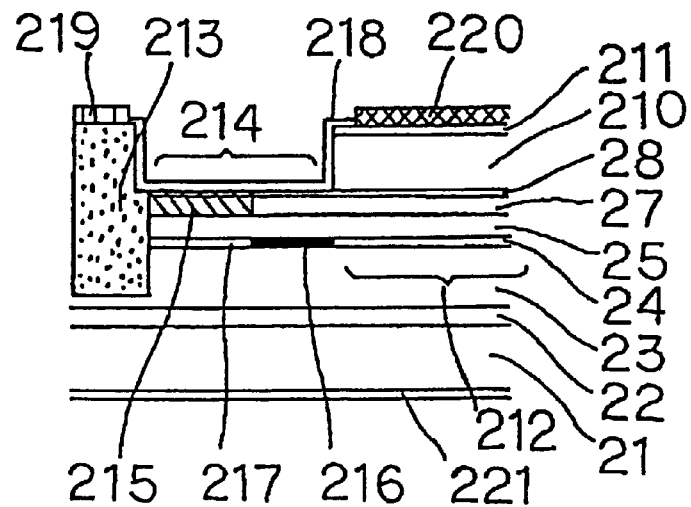
FIG. 2 is a schematic cross-sectional view showing another device structure of the present invention.

Meanwhile, in a device structure for the second aspect of the present invention shown in FIG. 2, a concentration-lowered field buffer layer region also eats into the inside of a cap layer in said photo-sensitive section by design to form a concentration-lowered field buffer region 216 so that the basic functions of this structure to suppress the edge-multiplication and to expand the manufacturing tolerance are the same as in the first aspect of the present invention. This second aspect has an advantage over the first aspect, since a manufacturing step of etching a thin ring-shaped layer 115 for the first aspect can be omitted. In this second structure, the separation between the photo-sensitive region 212 and the first conductive-type acquired region 213 is carried out by a highly-resistive region 215.

In the first and the second aspects of the present invention described above, the fabrication of the respective structures can be carried out very easily, because etching stop layers 16, 18, 19 and 28 are inserted in appropriate places to allow the selective etching readily at the time of formation of a ring-shaped trench 114 or 214 in the periphery of said photo-sensitive section or a thin ring-shaped cap layer 115. However, even without those etching stop layers, the above-mentioned shapes can be fabricated relatively easily if the normal dry etching method with an etching accuracy in the direction of the depth of about 100 angstrom is employed.

Further, with respect to the formation of regions of field buffer layers 116, 117, 216 and 217 in FIG. 1 and FIG. 2 where the carrier concentration thereof are lowered as well as the formation of a highly-resistive region 215, a preferred method is either comprising steps of the ion implantation of any selected among Ti, Fe, Co, O, H, He, B, Ar, N and C or a combination of those, and the subsequent thermal annealing, or a step of diffusion of impurities.

Next, it is described below that the present invention differs from the second example of the prior art shown in FIG. 7 (Japanese Patent Application Laid-open No. 13990/1980) and the third example of the prior art shown in FIG. 8 (Proc. 13th European Conf. Optical Communication, pp. 55–61, 1987).

Figure 7:
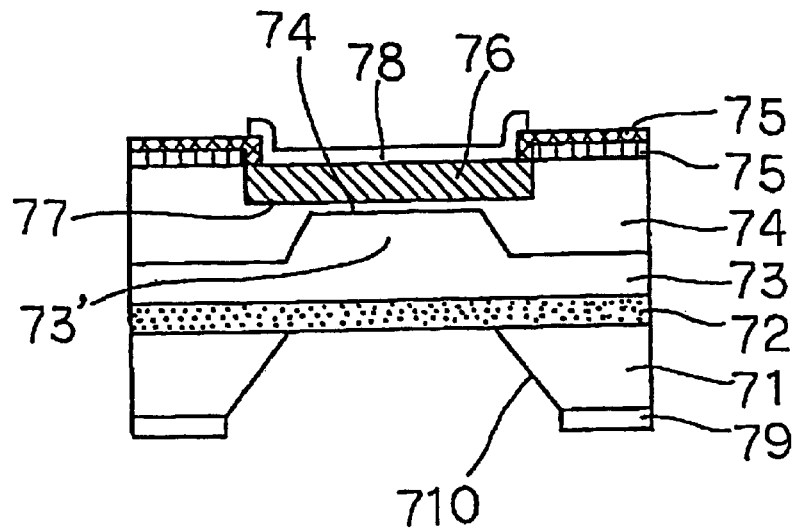
FIG. 7 is a schematic cross-sectional view showing a device structure of a second example of the prior art.

For the second example of the prior art shown in FIG. 7, a mesaform GaAs section 73' is formed as a convex portion and then the planarization is made by re-growing an AlGaAs layer 74 with a low carrier concentration. While an additional process of etching and re-growing is necessary for this conventional structure to generate a difference in carrier concentration, the structure of the present invention does not require such a process that may lead to a dark current increase or a reduction in yield. Further, the structure of this second conventional example is unified-type, in which the mesaform GaAs layer 73' formed first serves as both a multiplication layer and a photo-absorption layer and the carrier concentration thereof is also uniform throughout the whole layer.

In an embodiment of the above mentioned prior art (Japanese Patent Application Laid-open No. 13990/1980), this carrier concentration is described as a low carrier concentration ($5\times10^{15}$ cm$^{-3}$). Consequently, this mesaform layer does not have such an effect as a field buffer layer in the separate absorption and multiplication (SAM) type structure of the present invention (the electric field drop effect using a thin film), which clearly indicates a difference from the present invention.

Figure 8:
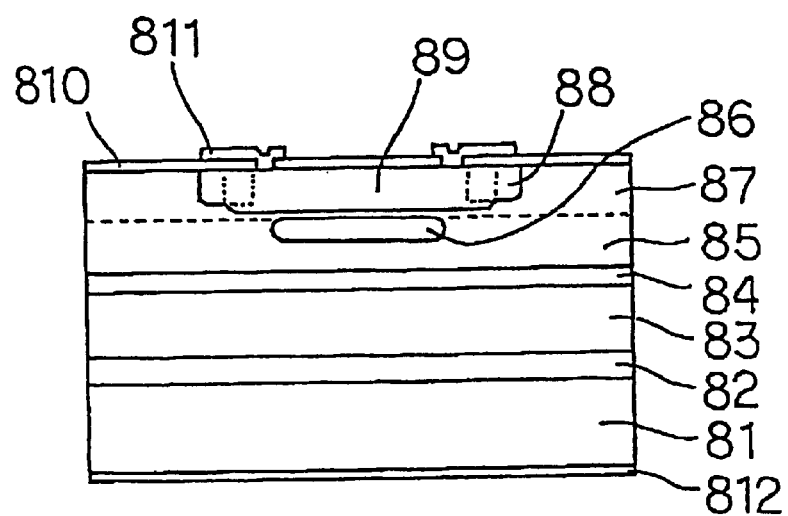
FIG. 8 is a schematic cross-sectional view showing a device structure of a third example of the prior art.

Meanwhile, for the third example of the prior art shown in FIG. 8, several layers up to an n$^-$-InP layer 85 are grown first and then an n-InP (Si) region 86 that serves as a multiplication layer is formed by ion implantation. Thereafter an n$^-$-InP cap layer 87 is re-grown.

While an additional process of ion implantation, annealing and the subsequent re-growing is necessary for this conventional structure to generate a difference in carrier concentration, the structure of the present invention does not require such a process that may lead to a dark current increase or a reduction in yield.

Further, in the structure of this third conventional example, a section into which a change in the carrier concentration is introduced by means of ion implantation is a multiplication region 86. Therefore, this structure is basically different from that of the present invention in which the concentration changed is that of a field buffer layer.

EMBODIMENTS

Referring to the drawings, the present invention is now described in detail by the following examples.

FIRST EMBODIMENT

Referring to FIG. 1, a first embodiment is described. Firstly, on a semi-insulating (SI-) InP substrate 11, a p-type buffer layer 12 with a thickness of about 1 μm, a p$^-$-type InGaAs photo-absorption layer 13 with a thickness of 1~1.5 μm, a p$^+$-type InP field buffer layer 14 with a thickness of 30~100 nm, an undoped InAlGaAs/InAlAs superlattice multiplication layer 15 with a thickness of 0.27 μm, an undoped InP third etching stop layer 16 with a thickness of 10 nm, an n$^+$-type InAlAs second cap layer 17 with a thickness of 0.1 μm, an n$^+$-type InGaAs second etching stop layer 18 with a thickness of 10 nm, an n$^+$-type InP first etching stop layer 19 with a thickness of 10 nm, an n$^+$-type InAlAs first cap layer 110 with a thickness of 0.5 μm and an n$^+$-type InGaAs contact layer 111 with a thickness of 0.1 μm are grown in succession by the gas-source molecular beam epitaxy (MBE) method.

Next, in a peripheral region of a circular photo-sensitive region 112 with a diameter of 25 μm, a thin cap layer region 115 with a width of 1~10 μm and, in a further periphery, a ring-shaped isolation trench 114 with a width of 2~10 μm are formed by selective etching using the above-mentioned etching stop layers 16, 18 and 19. Thereafter, using a photoresist as a mask, Ti or the like is implanted selectively into the thin cap layer 115 and the ring-shaped isolation trench 114 by means of ion implantation. The depth of implantation is determined so that the range reaches the field buffer layer 14.

A profile for the ion implantation can be approximated by a Gaussian function and has a long tail in the direction of the depth. As a result, even implanted through the thin cap layer region 115, some of implanted-Ti ions or the like reach a field buffer layer 116 directly under the thin cap layer 115 so that it is possible to lower the p-concentration in that part.

Following the ion implantation, annealing is applied fittingly, and thereafter a p-type acquired region 113 is formed selectively, by either Zn diffusion or Be ion implantation, in the peripheral region of the ring-shaped isolation trench so as to leave out the internal circular region. Subsequently, a passivation film 118 and p- and n-electrodes 119 and 120 are formed and, after the substrate 11 is subjected to mirror polish to become 150 $\mu$m or so, an anti-reflective (AR) coat 121 is formed. The process described above accomplishes the fabrication of the planar-type avalanche photodiode that is the first embodiment of the present invention.

Concerning characteristics of the present device, even in a device with a layered structure specifically designed for a wide dynamic range (controlled by the field buffer layer 14), a multiplied dark current was demonstrated to be as low as 10~20 nA or so and high-speed characteristics (a GB product of 120 GHz) was confirmed. In respect to a long term stability of the dark current, highly reliable characteristics such as 1000 hours of aging at 200° C., for instance, caused no increase in dark current were confirmed.

SECOND EMBODIMENT

Referring to FIG. 2, a second embodiment is described. Firstly, on a SI-InP substrate 21, a p-type buffer layer 22 with a thickness of about 1 $\mu$m, a p$^-$-type InGaAs photo-absorption layer 23 with a thickness of 1~1.5 $\mu$m, a p$^+$-type InP field buffer layer 24 with a thickness of 30~100 nm, an undoped InAlGaAs/InAlAs superlattice multiplication layer 25 with a thickness of 0.27 $\mu$m, an n$^+$-type InAlAs second cap layer 27 with a thickness of 0.1 $\mu$m, an n$^+$-type InP etching stop layer 28 with a thickness of 10 nm, an n$^+$-type InAlAs first cap layer 210 with a thickness of 0.4 $\mu$m and an n$^+$-type InGaAs contact layer 211 with a thickness of 0.1 $\mu$m are grown in succession by the gas-source MBE method.

Next, in a peripheral region of a circular photo-sensitive region 212 with a diameter of 25 $\mu$m, a ring-shaped isolation trench 214 with a width of 3~10 $\mu$m is formed by selective etching using the etching stop layer 28. Thereafter, using a photoresist as a mask, Fe or the like is injected selectively by means of ion implantation from the periphery of said ring-shaped isolation trench 214 towards the inside so as to form a highly-resistive region 215 with a depth of 0.1 $\mu$m or so. Following this, using a photoresist as a mask, Ti or the like is injected selectively into said ring-shaped isolation trench 214 by means of ion implantation.

The depth of implantation is determined so that the range reaches said field buffer layer 24. Ti ions reach a field buffer layer region 216 located directly under said thin cap layer, as section 217 located well as directly under said highly-resistive region 215 so that it is possible to lower the p-concentration in that part. Following the ion implantation, annealing is applied fittingly, and thereafter a p-type acquired region 213 is formed selectively, by either Zn diffusion or Be ion implantation, in the peripheral region of said highly-resistive region 215. Subsequently, a passivation film 218 and p- and n-electrodes 219 and 220 are formed and, after the substrate 21 is subjected to mirror polish to become 150 $\mu$m or so, an AR coat 221 is formed. The process described above accomplishes the fabrication of the planar-type avalanche photodiode that is the second embodiment of the present invention.

Concerning characteristics of the present device, even in a device with a layered structure specifically designed for a wide dynamic range (controlled by the field buffer layer 24), a multiplied dark current was demonstrated to be as low as 10~20 nA or so and high-speed characteristics (a GB product of 120 GHz) was confirmed. In respect to a long term stability of the dark current, highly reliable characteristics such as 1000 hours of aging at 200° C., for instance, caused no increase in dark current were confirmed.

The first and second embodiments herein are described with the device structure in which, for the multiplication layer and the field buffer layer, an InAlAs/InAlGaAs superlattice and InP are utilized, respectively. However, in case of the device structure in which, for the multiplication layer, an InAlAs/InGaAsP superlattice, an InAlAs/InGaAs superlattice or a semiconductor layer containing Al (InAlAs, InAlAsP), and, for the field buffer layer, InAlAs or InGaAsP are employed, as well as in case of the device structure in which these two layers are composed of a combination of the above, with only the multiplication layer and the field buffer layer being changed, manufacturing steps to realize the structure of the present invention and effects on characteristics obtained thereby are all the same.

Further, the ion species for ion implantation are not limited to those described in embodiments. With the ions mentioned in claim 10 and 12, the mere use of the appropriately optimized annealing condition for activation which depends on the ion implantation species enables to attain the same effects altogether.

Further, although the first and second embodiments illustrate the cases with etching stop layers being used, even if no etching layers are used, the normal dry etching method can achieve manufacturing the similar shape of the device without impairing the accuracy in the direction of the depths so that the purport thereof is the very same as that of the present invention.

Further, while the drawings showing the present embodiments illustrate only the back-illuminated structure, if the top-illuminated structure for which no description is given herein is used, the fundamentally same effects as the present invention are provided.

Further, although the SI-InP substrate is used for the description of the present embodiments, the present invention is not basically limited by the substrate conductivity. Therefore, an n-type or p-type InP substrate may be used to achieve the similar effect.

EFFECTS OF THE INVENTION

Accordingly, the present invention enables to manufacture a highly reliable planar-type APD with a great manufacturing tolerance and to realize a highly reliable high-sensitivity 2.5~10 Gb/s optical receiver which is suitable for use in trunk line optical fiber communication systems or the like.

What is claimed is:

1. A planar-type avalanche photodiode; having on a semiconductor substrate:
 a layered structure having a photo-sensitive region comprising a first conductive-type semiconductor buffer layer, a first conductive-type semiconductor photo-absorption layer, a first conductive-type semiconductor field buffer layer, a semiconductor multiplication layer, a second conductive-type semiconductor cap layer and a second conductive-type semiconductor contact layer;
 a first conductive-type acquired region, in a peripheral section of the photo-sensitive region, from the surface down to a level at least deep enough to reach said first conductive-type semiconductor field buffer layer; and
 a ring-shaped isolation trench region, between the second conductive-type semiconductor cap layer in said photo-sensitive region and said first conductive-type acquired region, with a depth that is equivalent to a sum of thicknesses of said second conductive-type semiconductor contact layer and cap layer; wherein:

a ring-shaped region of the second conductive-type semiconductor cap layer that is inscribed in said ring-shaped isolation trench and located in the periphery of the photo-sensitive region is formed thin to have a thickness equal to or less than the thickness of said semiconductor multiplication layer; and the first conductive-type semiconductor field buffer layer located directly under the ring-shaped region, together with a peripheral region in the field buffer layer, is formed to have a lower carrier concentration than the first conductive-type semiconductor field buffer layer in said photo-sensitive region.

2. A planar-type avalanche photodiode according to claim 1, wherein a first etching stop layer is set between said conductive-type semiconductor multiplication layer and second semiconductor cap layer.

3. A planar-type avalanche photodiode according to claim 1, wherein said second conductive-type semiconductor cap layer is divided in the direction of layers and a second and a third etching stop layers are set in between.

4. A planar-type avalanche photodiode; having on a semiconductor substrate:

a layered structure having a photo-sensitive region comprising a first conductive-type semiconductor buffer layer, a first conductive-type semiconductor photo-absorption layer, a first conductive-type semiconductor field buffer layer, a semiconductor multiplication layer, a second conductive-type semiconductor cap layer and a second conductive-type semiconductor contact layer;

a first conductive-type acquired region, in a peripheral section of the photo-sensitive region, from the surface down to a level at least deep enough to reach said first conductive type semiconductor field buffer layer;

a ring-shaped isolation trench region, between the second conductive-type semiconductor cap layer in said photo-sensitive region and said first conductive-type acquired region, with a depth that is more than the depth of said second conductive-type semiconductor contact layer and less than the depth of said second conductive-type semiconductor cap layer; and, in addition, a highly-resistive region in an outer ring-shaped region of the second conductive-type semiconductor cap layer that is formed, by dividing said ring-shaped isolation trench into two ring-shaped concentric regions, to a depth that reaches said semiconductor multiplication layer; wherein:

said first conductive-type semiconductor field buffer layer located directly under an internal one of the two ring-shaped concentric regions, together with a peripheral region in the first conductive-type field buffer layer, is formed to have a lower carrier concentration than the first conductive-type field buffer layer in said photo-sensitive region.

5. A planar-type avalanche photodiode according to claim 4, wherein said second conductive-type semiconductor cap layer is divided in the direction of the layers and the first etching stop layer is set in between.

6. A planar-type avalanche photodiode according to claim 1, wherein said semiconductor multiplication layer is composed of a material selected from the group consisting of InAlAs, InAlAsP, semiconductor alloy compounds containing InAlAs, an InAlAs/InAlGaAs superlattice, an InAlAs/InGaAs superlattice and an InAlAs/InGaAsP superlattice.

7. A planar-type avalanche photodiode according to claim 1, wherein said second conductive-type semiconductor field buffer layer is composed of a material selected from the group consisting of InP, InGaAsP, InAlAs, InAlGaAs and InlAsP.

8. A planar-type avalanche photodiode according to claims 2, wherein the first etching stop layer in said device structure is composed of InP.

9. A planar-type avalanche photodiode according to claim 3, wherein the second etching stop layer in said device structure is composed of InP and the third etching stop layer therein is composed of InGaAs or InAlGaAs.

10. A planar-type avalanche photodiode according to claim 4, wherein said highly-resistive region is formed by ion implantation of any selected among Ti, Fe, Co, O, H, He, B, Ar, N and C or a combination of these, or alternatively by diffusion of impurities.

11. A planar-type avalanche photodiode according to claim 5, wherein the first etching stop layer in said device structure is composed of InP.

12. A planar-type avalanche photodiode according to anyone of claims 1 to 11, wherein said field buffer layer region with the modulated carrier concentration is formed by ion implantation of any selected among Ti, Fe, Co, O, H, He, B, Ar, N and C or a combination of these, or alternatively by diffusion of impurities.

13. A planar-type avalanche photodiode according to claim 4, wherein said semiconductor multiplication layer is composed of a material selected from the group consisting of InAlAs, InAlAsP, semiconductor alloy compounds containing InAlAs, an InAlAs/InAlGaAs superlattice, an InAlAs/InGaAs superlattice and an InAlAs/InGaAsP superlattice.

* * * * *